United States Patent
Chen et al.

(10) Patent No.: US 8,859,384 B1
(45) Date of Patent: Oct. 14, 2014

(54) INDUCTOR FORMATION WITH SIDEWALL IMAGE TRANSFER

(71) Applicant: International Business Machines Corporation, Armonk, NY (US)

(72) Inventors: Hsueh-Chung H. Chen, Cohoes, NY (US); Hong He, Schenectady, NY (US); Chiahsun Tseng, Wynantskill, NY (US); Chun-Chen Yeh, Clifton Park, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/957,022

(22) Filed: Aug. 1, 2013

(51) Int. Cl.
*H01L 21/20* (2006.01)
*H01L 49/02* (2006.01)

(52) U.S. Cl.
CPC .................................. *H01L 28/10* (2013.01)
USPC ............................................ 438/381; 257/531

(58) Field of Classification Search
USPC .............. 257/99, 531, 622, E21.02; 438/381, 438/706; 336/200
See application file for complete search history.

(56) References Cited

U.S. PATENT DOCUMENTS

| | | | |
|---|---|---|---|
| 5,336,921 A * | 8/1994 | Sundaram et al. | ............ 257/531 |
| 6,037,649 A | 3/2000 | Liou | |
| 6,639,298 B2 | 10/2003 | Chaudhry et al. | |
| 7,118,925 B2 | 10/2006 | Brennan et al. | |
| 7,301,210 B2 | 11/2007 | Abadeer et al. | |
| 7,667,566 B2 | 2/2010 | Hsu et al. | |
| 8,188,570 B2 | 5/2012 | Levy et al. | |
| 8,354,325 B1 | 1/2013 | Dao et al. | |
| 8,580,692 B2 * | 11/2013 | Arnold et al. | ................. 438/706 |
| 8,586,478 B2 * | 11/2013 | Soda et al. | .................... 438/671 |
| 2012/0319164 A1 | 12/2012 | Inaba | |

OTHER PUBLICATIONS

Namba, H., et al. "On-Chip Vertically Coiled Solenoid Inductors and Transformers for RF SOC Using 90nm CMOS Interconnect Technology" Radio Frequency Integrated Circuits Symposium (RFIC), 2011 IEEE. Jun. 2011. (4 pages).

Kawasaki, H., et al. "Challenges and Solutions of FinFET Integration in an SRAM Cell and a Logic Circuit for 22 nm Node and Beyond" Electron Devices Meeting (IEDM), 2009 IEEE International. Dec. 2009. pp. 1-4.

* cited by examiner

*Primary Examiner* — Mohamad Musleh
*Assistant Examiner* — Brian Turner
(74) *Attorney, Agent, or Firm* — Tutunjian & Bitetto, P.C.; Vazken Alexanian

(57) ABSTRACT

Methods for forming inductors. The methods include forming sidewalls around a mandrel over a conductor layer; removing material from the conductor layer around a region defined by the sidewalls; removing the mandrel; partially etching the conductor layer in a region between the sidewalls; etching the partially etched conductor layer to form separate metal segments; depositing a dielectric material in and around the metal segments; and forming conductive lines between exposed contacts of adjacent metal segments.

17 Claims, 8 Drawing Sheets

INDUCTOR FORMATION WITH SIDEWALL IMAGE TRANSFER

BACKGROUND

1. Technical Field

The present invention relates to semiconductor device design and, more particularly, to inductor design using sidewall image transfer.

2. Description of the Related Art

Inductors are a basic component of electric circuits that store energy as a magnetic field. To accomplish this, an inductor is usually formed from one or more wire loops. If an external voltage is applied, such that a current passes through the loops, that current induces a magnetic field. If the external voltage is then shut off, the magnetic field will resist the change in current, inducing a current in the wire to replace the externally supplied current until the energy in the magnetic field is exhausted.

Forming small-sized inductors for use with semiconductor devices can be challenging. Conventional methods include forming a first set of parallel metal wires, forming vias, and then forming a second set of parallel metal wires. The vias connecting the metal wires create the loops that form the inductor. This process is complicated, however, as it needs precise alignment between the metal wires and vias.

SUMMARY

A method for forming an inductor includes forming sidewalls around a mandrel over a conductor layer; removing material from the conductor layer around a region defined by the sidewalls; removing the mandrel; partially etching the conductor layer in a region between the sidewalls; etching the partially etched conductor layer to form separate metal segments; depositing a dielectric material in and around the metal segments; and forming conductive lines between exposed contacts of adjacent metal segments.

An inductor includes a plurality of 'u'-shaped conductive segments, each conductive segment being a single, rectilinear conductor and having a first and a second terminal, wherein the conductive segments are arranged linearly; a plurality of conductive wires connecting the first terminal of each metal segment to the second terminal of an adjacent metal segment, wherein the conductive wires form diagonal connections with respect to the linear arrangement of the conductive segments; and a dielectric that occupies an internal space formed by the conductive segments and the conductive wires A method for forming an inductor includes forming first sidewalls around a first mandrel over a conductor layer; removing material from a second mandrel layer around a region defined by the first sidewalls to form second mandrels; removing the first mandrel and the first sidewalls; forming second sidewalls around the second mandrels; partially etching the conductor layer in regions between respective sets of second sidewalls; etching the partially etched conductor layer to form separate metal segments; depositing a dielectric material in and around the metal segments; and forming conductive lines between exposed contacts of adjacent metal segments.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
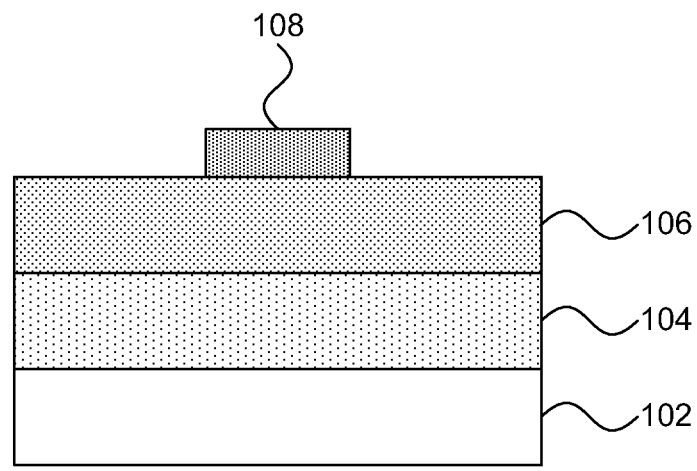
FIG. 1 is a cross-sectional view of a step of forming an inductor with sidewall image transfer in accordance with the present principles.

Embodiments of the present principles provide simplified inductor formation using sidewall image transfer techniques. This allows the first set of metal wires and its vias to be formed together, obviating a step in the formation of the inductor. Not only does this simplify inductor formation, but it also allows inductors to be formed on a smaller scale.

To accomplish this, sidewall image transfer is used to define the inductor structure. Sidewall image transfer is a technique that uses hardmask blocking to lay out features that might otherwise be too small for standard lithographic techniques.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a step in forming an inductor is shown. A substrate 102 may be formed from any appropriate substrate material including, e.g., a bulk semiconductor such as silicon or a semiconductor-on-insulator substrate. A metal layer 104 is formed on the substrate with a hardmask layer 106 on top. The metal layer 104 may be any appropriate conductor and should be selected in accordance with the desired properties of the inductor being formed. The hardmask layer 106 may be any appropriate hardmask material such as silicon nitride.

A mandrel 108 is formed on the hardmask layer 106. The mandrel 108 may be formed from any appropriate material including, e.g., titanium nitride. The mandrel 108 is positioned over a region defined for inductor formation and should have the same length as the inductor will have.

Figure 2:
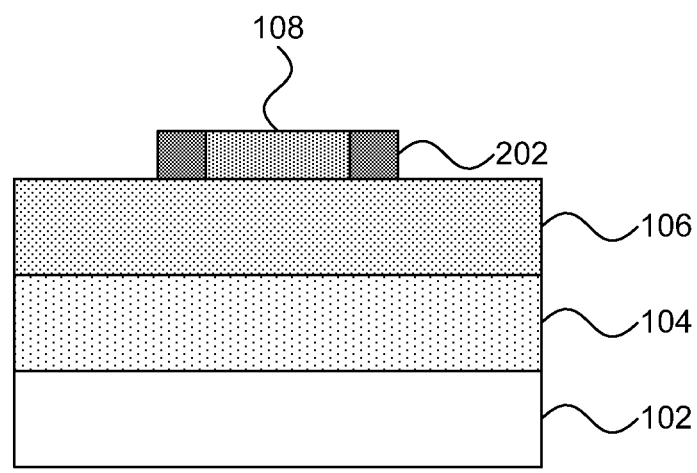
FIG. 2 is a cross-sectional view of a step of forming an inductor with sidewall image transfer in accordance with the present principles.

Referring now to FIG. 2, a step in forming an inductor is shown. Sidewalls 202 are formed by depositing a spacer material such as silicon dioxide and etching the spacer material to remove any excess. The sidewalls 202 should be formed to a width that corresponds to the desired width of the inductor wires.

Figure 3:
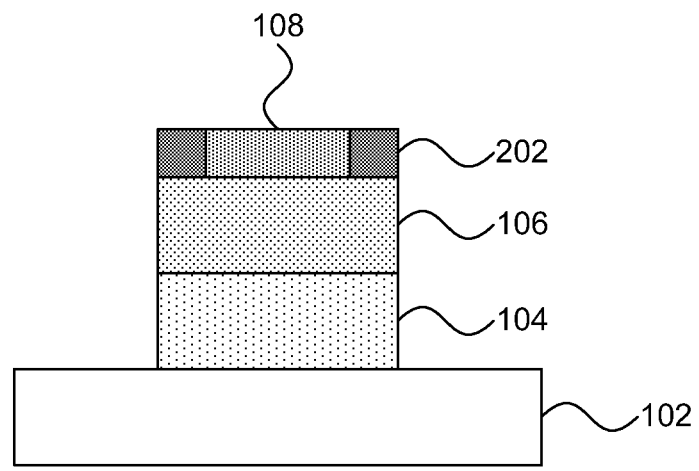
FIG. 3 is a cross-sectional view of a step of forming an inductor with sidewall image transfer in accordance with the present principles.

Referring now to FIG. 3, a step in forming an inductor is shown. The metal layer 104 and the hardmask layer 106 are etched around the mandrel 108 and the sidewalls 202 down to the substrate layer 102. This etch should be a highly anisotropic etch, such as a reactive ion etch (RIE).

Figure 4:
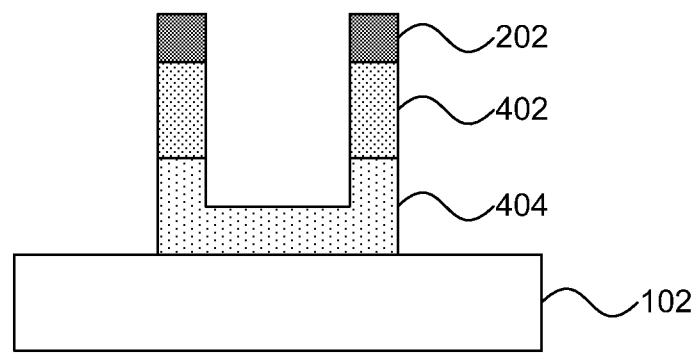
FIG. 4 is a cross-sectional view of a step of forming an inductor with sidewall image transfer in accordance with the present principles.

Referring now to FIG. 4, a step in forming an inductor is shown. The mandrel 108 is removed and an etch is applied that reaches partway through the metal layer 104. The etch may be a timed RIE, leaving etched hardmask layer 402 and etched metal layer 404. The etched metal layer 404 should be etched to a depth that leaves sufficient material to form a wire in the inductor.

Figure 5:
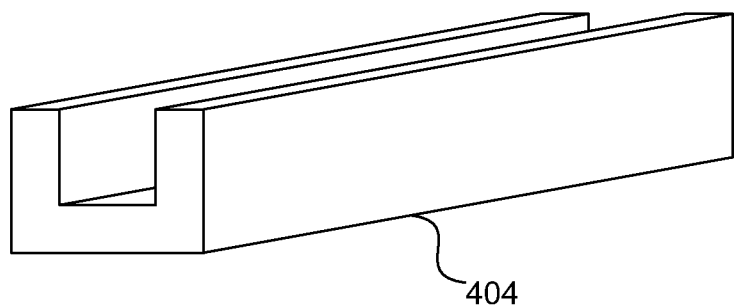
FIG. 5 is a perspective view of a step of forming an inductor with sidewall image transfer in accordance with the present principles.

Referring now to FIG. 5, a perspective view of the etched metal layer 404 is shown. The height, width, and thickness dimensions correspond to attributes of the inductor being formed. This layer 404 will be divided into individual loop segments and then reconnected with metal wires to form a coil.

Figure 6:
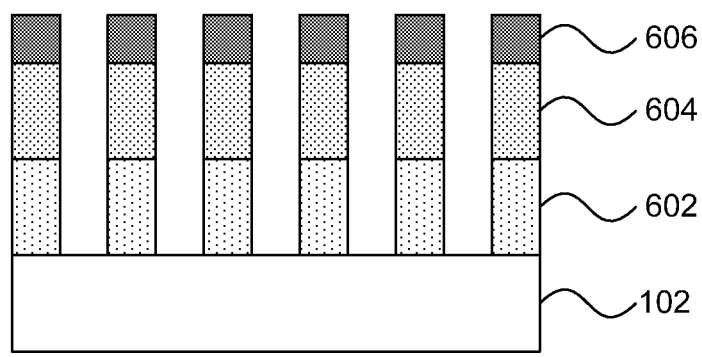
FIG. 6 is a side view of a step of forming an inductor with sidewall image transfer in accordance with the present principles.

Referring now to FIG. 6, a step in forming an inductor is shown. This view looks at the metal layer 404 from the side. An etch is performed down to the substrate layer 102 that separates individual metal segments 602 from one another. Portions of the hardmask layer 604 and the sidewalls 606 remain.

Figure 7:
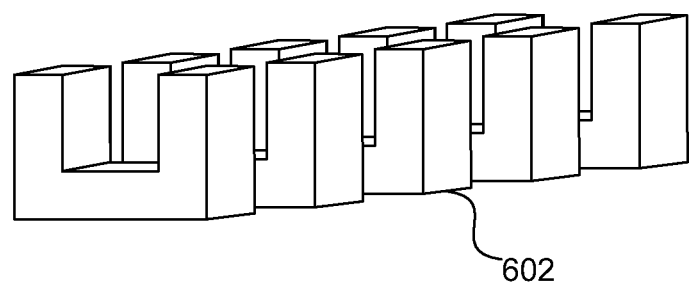
FIG. 7 is a perspective view of a step of forming an inductor with sidewall image transfer in accordance with the present principles.

Referring now to FIG. 7, a perspective view of the etched metal segments 602 is shown. The segments 602 are separated by a minimal distance according to the etching technology used. The separation should be as small as possible to provide maximal induction in the space available.

Figure 8:
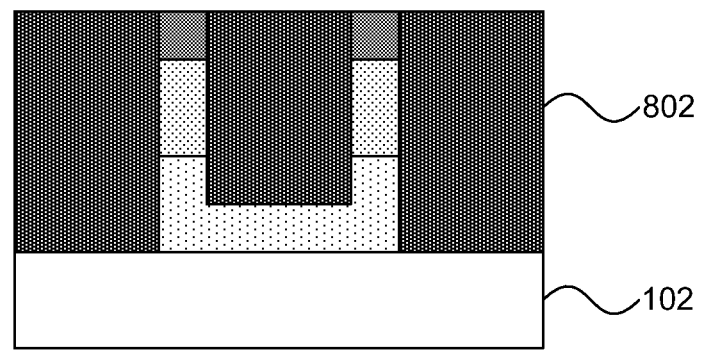
FIG. 8 is a cross-sectional view of a step of forming an inductor with sidewall image transfer in accordance with the present principles.

Referring now to FIG. 8, a step in forming an inductor is shown. A dielectric fill material 802 is deposited around the structures and may be formed from, e.g., a low-k dielectric material such as silicon dioxide. This fill material 802 helps minimize capacitive coupling between the metal wires of the inductor, because this cross-talk may result in loss or interference of the signal.

Figure 9:
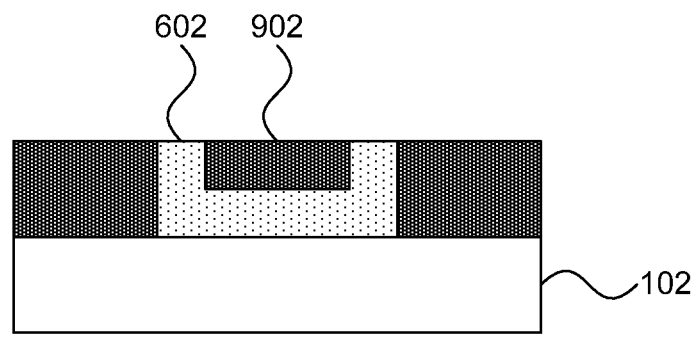
FIG. 9 is a cross-sectional view of a step of forming an inductor with sidewall image transfer in accordance with the present principles.

Referring now to FIG. 9, a step in forming an inductor is shown. Chemical mechanical planarization (CMP) is used to remove the remaining hardmask and sidewall material, leaving a smooth surface 902 with the tops of the metal segments 602 exposed. The metal segments 602 define the cross-section of the eventual inductor. In one exemplary embodiment, the CMP grinds surface 902 down to a level where the partially etched portion has a depth half that of the unetched portion. Exemplary values for the width of the metal segments 602 are on the order of micrometers, with similar dimensions for the spacing between individual metal segments 602. The depth of the partially etched portion may be, for example, about 200-800 nm.

Figure 10:
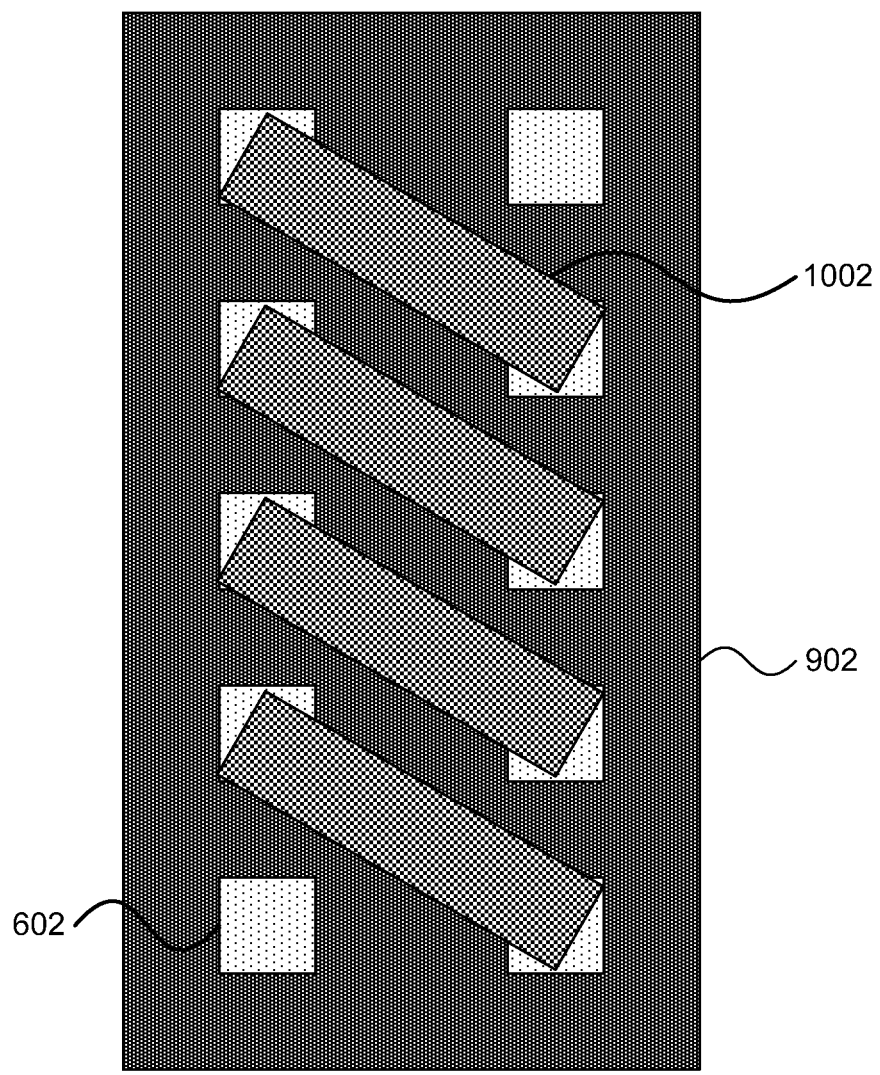
FIG. 10 is a top-down view of a step of forming an inductor with sidewall image transfer in accordance with the present principles.

Referring now to FIG. 10, a step in forming an inductor is shown. This view looks down on the structure of FIG. 9 from the top. Metal wires 1002 are patterned on top of the surface 902 to connect exposed ends of the metal segments 602. The metal wires 1002 may be formed using, e.g., atomic layer deposition, which results in good film conformality. A typical wire width is 6-10 nm with a 30 nm pitch between wires. Each metal wire 1002 connects two different metal segments 602, forming a continuous conductive path from the top to the bottom. This completes the inductor.

Figure 11:
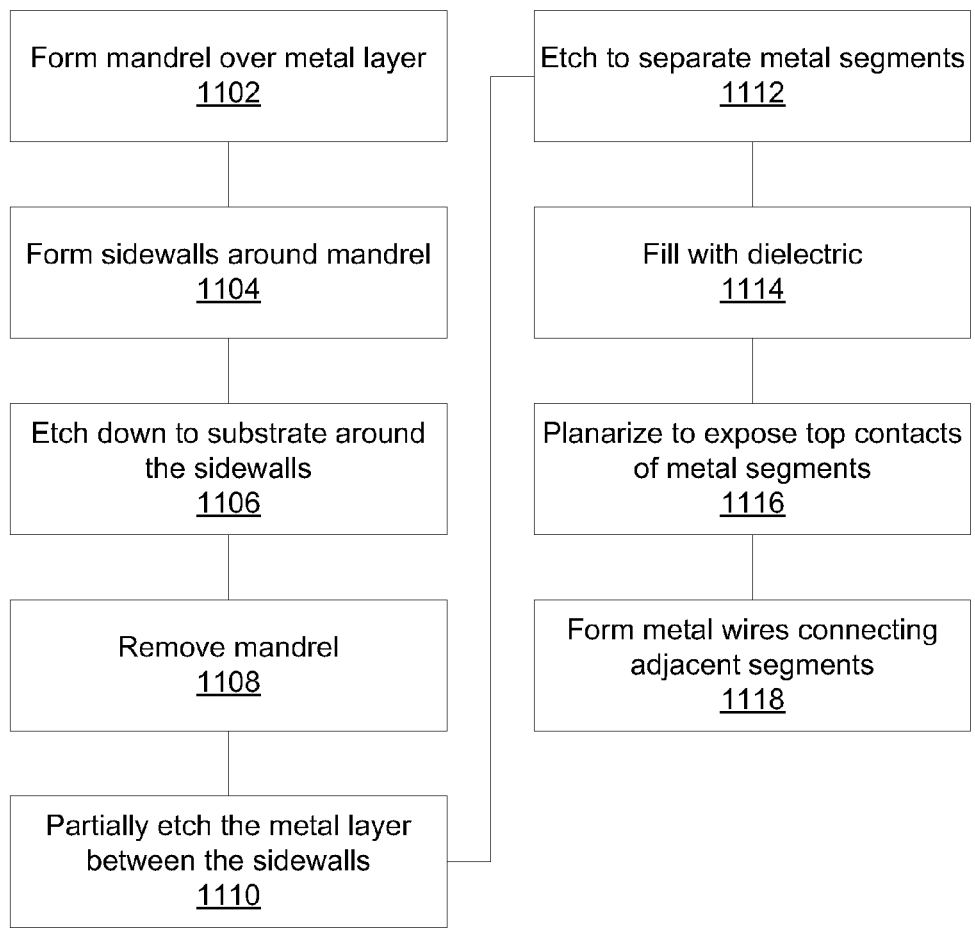
FIG. 11 is a block/flow diagram of a method of forming an inductor with sidewall image transfer in accordance with the present principles.

Referring now to FIG. 11, a method for forming an inductor is shown. Block 1102 forms mandrel 108 over the metal layer 104. The metal layer 104 may be formed on a substrate and a hardmask material 106 may be formed between the mandrel 108 and the metal layer 104. Block 1104 forms sidewalls 202 around the mandrel 108. Block 1106 etches the layers around the mandrel 108 and the sidewalls 202 down to the substrate 102. Block 1108 removes the mandrel 108, leaving the sidewalls standing free on top of the hardmask layer 106.

Block 1110 etches down between the sidewalls 202 to the metal layer 104, partially removing the metal and forming etched metal layer 404. The partial etch of the metal layer 104 may be any appropriate depth that allows a sufficient amount of dielectric material 802 to fit and that leaves sufficient metal material on the bottom to allow for good conductivity.

Block 1112 further etches the etched metal layer 404 to form separate metal segments 602. Block 1114 fills a dielectric material 802 around the segments 602 and block 1116 planarizes the surface 902 to expose top contacts for the metal segments 602. Block 1118 then patterns metal wires 1002 that join adjacent segments 602, forming a continuous coil that serves as an inductor.

Figure 12:
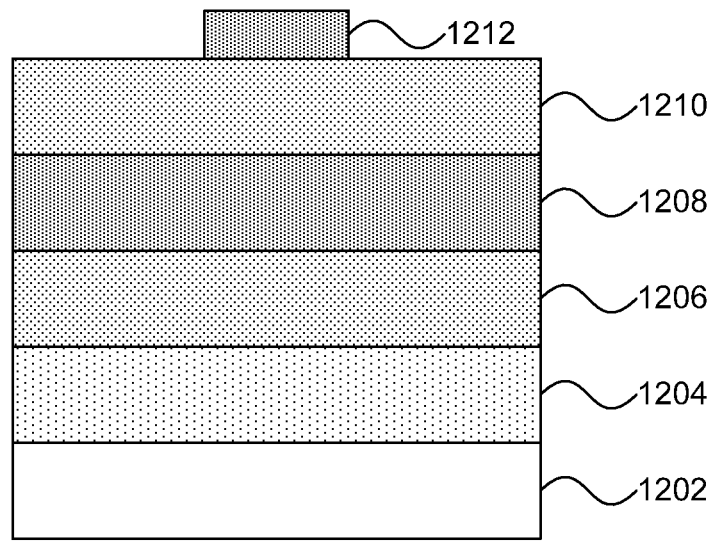
FIG. 12 is a cross-sectional view of step of an alternative embodiment of forming an inductor with sidewall image transfer in accordance with the present principles.

Referring now to FIG. 12, a step in an alternative embodiment of forming an inductor is shown. In this embodiment, a mandrel 1212 is formed over a second layer of mandrel material 1208, which in turn is formed over a metal layer 1204 on a substrate. Layers of hardmask material 1206 and 1210 separate the mandrel layers 1208 and 1212 from each other and from the metal layer 1204. The additional layer of mandrel material allows sidewall image transfer to be performed twice, such that the structures produced can be made even smaller.

Figure 13:
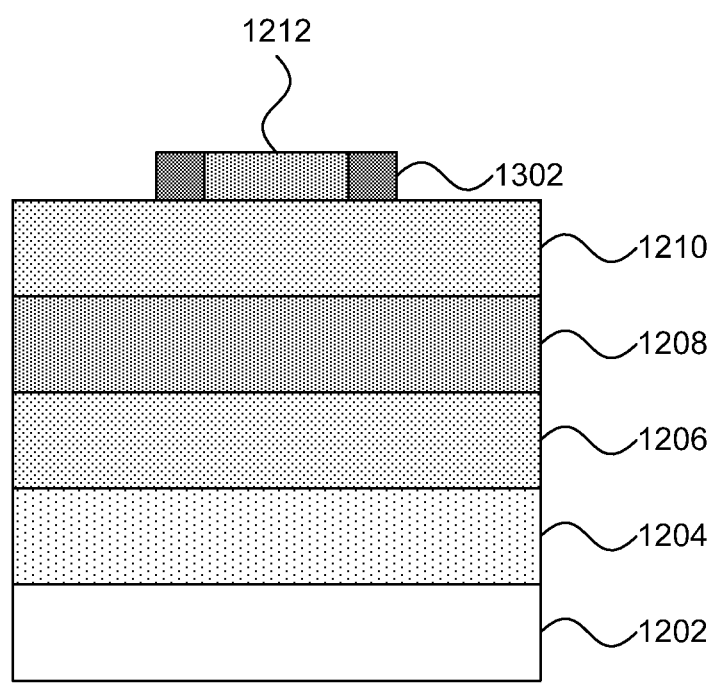
FIG. 13 is a cross-sectional view of step of an alternative embodiment of forming an inductor with sidewall image transfer in accordance with the present principles.

Referring now to FIG. 13, a step in an alternative embodiment of forming an inductor is shown. Sidewalls 1302 are formed by depositing spacer material, such as silicon dioxide, and etching the spacer material to remove any excess.

Figure 14:
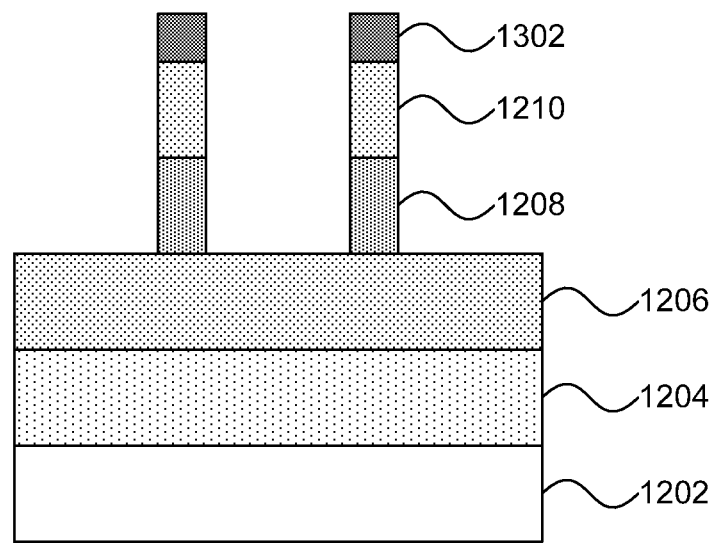
FIG. 14 is a cross-sectional view of step of an alternative embodiment of forming an inductor with sidewall image transfer in accordance with the present principles.

Referring now to FIG. 14, a step in an alternative embodiment of forming an inductor is shown. The mandrel 1212 is removed. The top hardmask layer 1210 and the second mandrel layer 1208 are etched around the sidewalls 1302, said etch stopping on the lower hardmask layer 1206. This may be accomplished by selectively etching the top hardmask layer 1210 and then selectively etching the second mandrel layer 1208, such that the bottom hardmask layer 1206 remains untouched.

Figure 15:
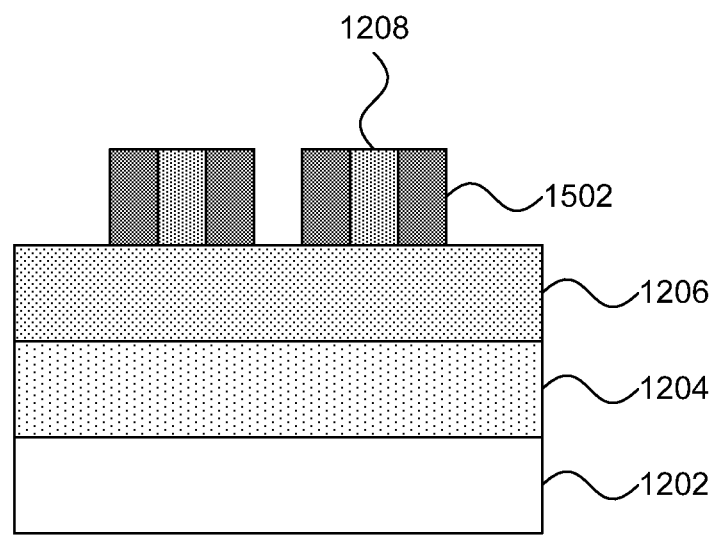
FIG. 15 is a cross-sectional view of step of an alternative embodiment of forming an inductor with sidewall image transfer in accordance with the present principles.

Referring now to FIG. 15, a step in an alternative embodiment of forming an inductor is shown. The remaining top hardmask layer 1210 and sidewalls 1302 are removed and new sidewalls 1502 are formed around the remaining second mandrel layer 1208.

Figure 16:
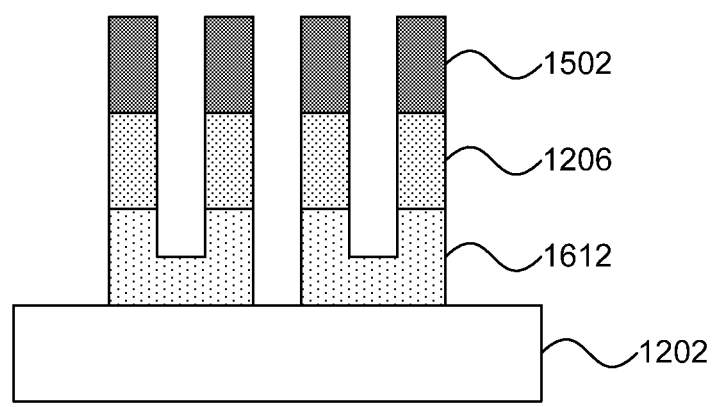
FIG. 16 is a cross-sectional view of step of an alternative embodiment of forming an inductor with sidewall image transfer in accordance with the present principles.

Referring now to FIG. 16, a step in an alternative embodiment of forming an inductor is shown. The lower hardmask layer 1206 and the metal layer 1612 are etched down to the substrate 1202 around the sidewalls 1208. The mandrels 1208 are then removed and an etch is performed that partially etches the metal layer 1612. This produces remaining metal layers corresponding to that shown in FIG. 5, but with a smaller feature size.

Having described preferred embodiments of inductors and sidewall image transfer methods of forming the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming an inductor, comprising:
    forming sidewalls around a mandrel over a conductor layer;
    removing material from the conductor layer around a region defined by the sidewalls;
    removing the mandrel;
    partially etching the conductor layer in a region between the sidewalls;
    etching the partially etched conductor layer to form separate metal segments;
    depositing a dielectric material in and around the metal segments; and
    forming conductive lines between exposed contacts of adjacent metal segments.

2. The method of claim 1, wherein etching the partially etched conductor layer has a 'u'-shaped cross section.

3. The method of claim 2, wherein the 'u'-shaped cross section has a depth about twice as large as a thickness of the partially etched conductor layer.

4. The method of claim 1, wherein partially etching the conductor layer comprises a timed anisotropic etch.

5. The method of claim 1, wherein forming the conductive lines comprises depositing metal by atomic layer deposition.

6. The method of claim 1, wherein forming sidewalls comprises:
    depositing a uniform layer of sidewall material; and
    anisotropically etching the sidewall material to remove said material from horizontal surfaces.

7. The method of claim 1, further comprising planarizing to expose top contacts of the metal segments and to remove remaining sidewall material.

8. The method of claim 1, wherein forming conductive lines comprises connecting a series of metal segments by connecting a first exposed contact of one metal segment with a second exposed contact of a next metal segment.

9. The method of claim 1, wherein the conductive lines and the metal segments form a continuous conductive coil.

10. A method for forming an inductor, comprising:
- forming first sidewalls around a first mandrel over a conductor layer;
- removing material from a second mandrel layer around a region defined by the first sidewalls to form second mandrels;
- removing the first mandrel and the first sidewalls;
- forming second sidewalls around the second mandrels;
- partially etching the conductor layer in regions between respective sets of second sidewalls;
- etching the partially etched conductor layer to form separate metal segments;
- depositing a dielectric material in and around the metal segments; and
- forming conductive lines between exposed contacts of adjacent metal segments.

11. The method of claim 10, wherein etching the partially etched conductor layer has a 'u'-shaped cross section.

12. The method of claim 11, wherein the 'u'-shaped cross section has a depth about twice as large as a thickness of the partially etched conductor layer.

13. The method of claim 10, wherein partially etching the conductor layer comprises a timed anisotropic etch.

14. The method of claim 10, wherein forming first and second sidewalls comprises:
- depositing a uniform layer of sidewall material; and
- anisotropically etching the sidewall material to remove said material from horizontal surfaces.

15. The method of claim 10, further comprising planarizing to expose top contacts of the metal segments and to remove remaining sidewall material.

16. The method of claim 10, wherein forming conductive lines comprises connecting a series of metal segments by connecting a first exposed contact of one metal segment with a second exposed contact of a next metal segment.

17. The method of claim 10, wherein the conductive lines and the metal segments form a continuous conductive coil.

* * * * *